(12) United States Patent
Umise (10) Patent No.: US 11,189,514 B2
(45) Date of Patent: Nov. 30, 2021

(54) SUBSTRATE PROCESSING APPARATUS AND SUBSTRATE TRANSFER METHOD

(71) Applicant: TOKYO ELECTRON LIMITED, Tokyo (JP)

(72) Inventor: Takuya Umise, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/934,825

(22) Filed: Jul. 21, 2020

(65) Prior Publication Data
US 2021/0035838 A1    Feb. 4, 2021

(30) Foreign Application Priority Data

Jul. 29, 2019  (JP) .............................. JP2019-138914

(51) Int. Cl.
*H01L 21/677* (2006.01)
*H01L 21/67* (2006.01)

(52) U.S. Cl.
CPC .. *H01L 21/67745* (2013.01); *H01L 21/67173* (2013.01); *H01L 21/67184* (2013.01); *H01L 21/67196* (2013.01); *H01L 21/67742* (2013.01)

(58) Field of Classification Search
CPC ......... H01L 21/67745; H01L 21/67742; H01L 21/67184; H01L 21/67196; H01L 21/67173
See application file for complete search history.

(56) References Cited

U.S. PATENT DOCUMENTS

| | | | | |
|---|---|---|---|---|
| 6,440,261 | B1* | 8/2002 | Tepman | H01L 21/67161 118/715 |
| 9,502,275 | B1* | 11/2016 | Trussell | H01L 21/67706 |
| 10,710,819 | B1* | 7/2020 | Thanu | B25J 15/0616 |
| 2007/0000612 | A1* | 1/2007 | Nozawa | H01L 21/67167 156/345.32 |
| 2010/0215460 | A1* | 8/2010 | Watanabe | H01L 21/67161 414/217 |

(Continued)

FOREIGN PATENT DOCUMENTS

| | | | | |
|---|---|---|---|---|
| CN | 112309904 A | * | 2/2021 | ....... H01L 21/67745 |
| JP | 2017220410 A | * | 12/2017 | ....... H01L 21/67121 |
| WO | WO 2014/006804 A1 | | 1/2014 | |

*Primary Examiner* — Kaitlin S Joerger
(74) *Attorney, Agent, or Firm* — Fenwick & West LLP (57) ABSTRACT

A substrate processing apparatus includes a transfer chamber row of transfer chambers arranged linearly, a processing chamber row of processing chambers arranged on one side or both sides of the transfer chamber row, a driving mechanism for rotating/extending/contracting a transfer arm of a substrate transfer mechanism in each transfer chamber, and a controller. A center of a substrate supporting region in the processing chamber is positioned closer to the transfer chamber row than a line connecting a rotation axis of the transfer arm and a center of a gate valve. Further, when loading and unloading a substrate between the processing chamber and the adjacent transfer chamber, the controller controls the driving mechanism such that a center of the substrate held by the transfer arm passes along an outer side of a line that connects a rotation axis of the transfer arm and a center of a substrate supporting region.

9 Claims, 6 Drawing Sheets

(56) References Cited

U.S. PATENT DOCUMENTS

| | | | |
|---|---|---|---|
| 2011/0130858 A1* | 6/2011 | Fujii | B25J 9/1682 |
| | | | 700/112 |
| 2014/0044502 A1* | 2/2014 | Uemura | H01L 21/67745 |
| | | | 414/217 |
| 2014/0216658 A1* | 8/2014 | Minami | H01L 21/67184 |
| | | | 156/345.31 |
| 2014/0263165 A1* | 9/2014 | Hongkham | H01L 21/67184 |
| | | | 216/13 |
| 2017/0092517 A1* | 3/2017 | Ohashi | H01L 21/67276 |
| 2017/0159170 A1* | 6/2017 | Suzuki | C23C 14/34 |
| 2018/0040856 A1* | 2/2018 | Ishikawa | H01L 21/67748 |
| 2019/0164791 A1* | 5/2019 | Sugita | H01L 21/6831 |
| 2020/0340094 A1* | 10/2020 | Itabashi | H01L 51/56 |
| 2020/0384635 A1* | 12/2020 | Muthukamatchi | B25J 9/0009 |
| 2021/0005486 A1* | 1/2021 | Horiuchi | H01L 21/67196 |
| 2021/0151336 A1* | 5/2021 | Saigou | G05B 19/00 |

\* cited by examiner

SUBSTRATE PROCESSING APPARATUS AND SUBSTRATE TRANSFER METHOD

CROSS-REFERENCE TO RELATED APPLICATIONS

This application claims priority to Japanese Patent Application No. 2019-138914, filed on Jul. 29, 2019, the entire contents of which are incorporated herein by reference.

TECHNICAL FIELD

The present disclosure relates to a substrate processing apparatus and a substrate transfer method.

BACKGROUND

International patent application publication No. WO2014/006804 discloses a substrate processing apparatus in which multiple processing modules are sequentially used to perform a series of processes on a substrate in a vacuum atmosphere. In the substrate processing apparatus, a row of substrate transfer devices is provided in a transfer chamber maintained in a vacuum atmosphere. Each of the substrate transfer devices is configured to be rotatable horizontally and movable back and forth, and the substrate is delivered between the substrate transfer devices adjacent to each other in the transfer chamber. Further, rows of processing modules are arranged along the row of the substrate transfer devices at right and left sides, each of the processing modules performing a process to the substrate. The processing modules include a processing module, having a sidewall at a side of the row of the substrate transfer devices protruded toward a space between the adjacent substrate transfer devices, configured to deliver the substrate with respect to any one of the substrate transfer devices at a front side in an inclination direction of the sidewall and a rear side in the inclination direction of the sidewall.

The present disclosure provides a technique for preventing a scaling up of a substrate processing apparatus having a transfer chamber row with a plurality of transfer chambers arranged linearly and a processing chamber row with a plurality of processing chambers arranged along the transfer chamber row, or a technique for scaling down the substrate processing apparatus.

SUMMARY

In accordance with an aspect of the present disclosure, there is provided a substrate processing apparatus for processing a substrate including: a transfer chamber row of a plurality of transfer chambers arranged linearly and maintained in a vacuum atmosphere, each of the transfer chambers having therein a substrate transfer mechanism configured to hold and transfer the substrate using a rotatable and extensible/contractible transfer arm; a processing chamber row of a plurality of processing chambers maintained in a vacuum atmosphere and arranged on one side or both sides of the transfer chamber row along the transfer chamber row in a plan view, each of the processing chambers having therein a substrate supporting region on which the substrate is placed; a driving mechanism configured to rotate, extend, and contract the transfer arm; and a controller. Further, for a processing chamber connected to two transfer chambers adjacent thereto through gate valves, a center of the substrate supporting region in the processing chamber is positioned closer to the transfer chamber row such that lines connecting the center of the substrate supporting region with rotation axes of transfer arms in the two transfer chambers adjacent to the processing chamber are closer to the transfer chamber row than lines respectively connecting the rotation axes of transfer arms in the two transfer chambers with centers of the gate valves with respect to the two transfer chambers, and the controller is configured to control, when loading and unloading the substrate between the processing chamber and each of the two transfer chambers adjacent to the processing chamber, the driving mechanism such that a center of the substrate held by the transfer arm of each of the two transfer chambers passes along an outer side of a line that connects the rotation axis of the transfer arm and the center of the substrate supporting region in the processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor device manufacturing process, various processes such as film formation and the like are performed on a substrate such as a semiconductor wafer (hereinafter referred to as "wafer") in individual vacuum processing chambers. The film formation and the like are performed on one substrate multiple times, if necessary. Therefore, in order to improve throughput, a substrate processing apparatus for consecutively performing various processes without exposing a substrate to the atmosphere is provided, and the substrate processing apparatus is configured by connecting processing chambers for performing different processes or the same processes through a transfer chamber for transferring a substrate under a vacuum atmosphere. In such a substrate processing apparatus, the substrate is linearly loaded and unloaded between each processing chamber and the transfer chamber.

Figure 1:
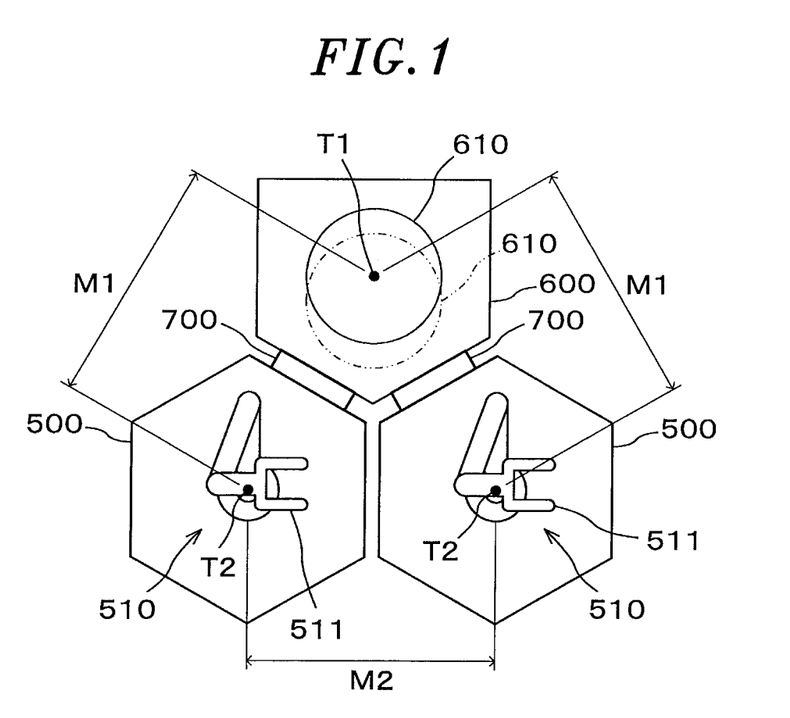
FIGS. 1 and 2 explain an object of the present disclosure.

As the above-described substrate processing apparatus, there is considered an apparatus having a row of transfer chambers linearly arranged and a row of processing chambers arranged along the row of the transfer chambers. In such a substrate processing apparatus, as shown in FIG. 1, a substrate transfer mechanism 510 having a rotatable and extensible/contractible transfer arm 511 configured to hold a substrate is disposed in each transfer chamber 500, and a substrate support 610 having a substrate supporting region on an upper surface thereof is disposed in each processing chamber 600. A processing chamber 600 of the row of the processing chambers is connected to two adjacent transfer chambers 500 of the row of the transfer chambers through gate valves 700. The substrate can be loaded and unloaded between the processing chamber 600 and the two transfer chambers 500. For example, the position of the substrate support 610 in the processing chamber 600 is set such that a stage-to-arm distance M1 is equal to an arm-to-arm distance M2. The stage-to-arm distance M1 is a distance from a center point T1 of the substrate supporting region of the substrate support 610 to a rotation axis T2 of the transfer arm 511 in each of the two transfer chambers 500 connected to the processing chamber 600. The arm-to-arm distance M2 is a distance between the rotation axes T2. In the above-described substrate processing apparatus, the substrate is linearly loaded and unloaded between the processing chamber 600 and the transfer chambers 500. The installation angles of the gate valves 700 are set depending on the loading/unloading angle of the substrate. Specifically, the gate valves 700 are disposed to be orthogonal to a substrate loading/unloading direction.

Figure 2:
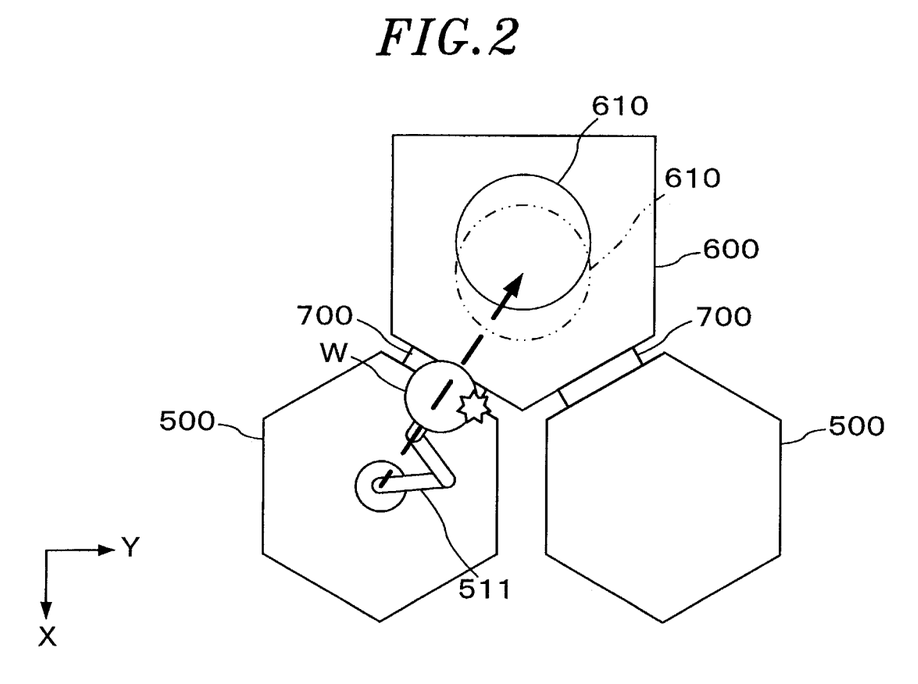

Further, in the above-described substrate processing apparatus having the row of the transfer chambers and the row of the processing chambers, it is considered to provide functional chambers such as relay chambers between the adjacent transfer chambers of the row of the transfer chambers. Each relay chamber allows the substrate to be transferred between the adjacent transfer chambers without passing through the processing chamber. In the case of providing the functional chambers, the length of the row of the transfer chambers in an arrangement direction of the transfer chambers is increased. In this case, in order to locate the substrate support 610 at a position indicated by a solid line in FIG. 2 in the processing chamber 600 such that the stage-to-arm distance M1 becomes equal to the arm-to-arm distance M2, it is required to move the substrate support 610 to the outer side in a width direction (X direction in FIG. 2) orthogonal to the arrangement direction of the transfer chambers (Y direction FIG. 2). Therefore, the width of the substrate processing apparatus is increased. In other words, the substrate processing apparatus is scaled up. If the substrate support 610 is not moved to the outer side in the width direction (i.e., the substrate support 610 is located at a position indicated by a dashed double-dotted line in FIG. 1) to avoid the scaling up, the substrate W that is being linearly transferred toward the center of the substrate supporting region of the substrate support 610 may collide with a wall surface of the gate valve 700 or the like and fall from the transfer arm 511. The collision can be avoided by changing an installation angle of each gate valve 700 depending on the substrate loading/unloading direction. However, it is difficult to change the installation angle of each gate valve 700 due to arrangement positions of other components of the substrate processing apparatus.

Further, the substrate processing apparatus can be scaled down by moving the substrate support 610 in the processing chamber 600 of the row of the processing chambers to an inner side in the width direction to be close to the row of the transfer chambers, i.e., to a position indicated by the dashed double-dotted line in FIG. 1, without changing the length of the row of the transfer chambers in the arrangement direction of the transfer chambers. In that case, however, the above-described problem still occurs.

Therefore, the present disclosure provides a technique for preventing a scale-up of the substrate processing apparatus having the row of the transfer chambers disposed linearly and the row of the processing chambers disposed along the row of the transfer chamber or scaling down the substrate processing apparatus.

Hereinafter, a substrate processing apparatus and a substrate transfer method according to embodiments of the present disclosure will be described with reference to the drawings. In this specification, like reference numerals will be given to like parts having substantially the same functions and redundant description thereof will be omitted.

Figure 3:
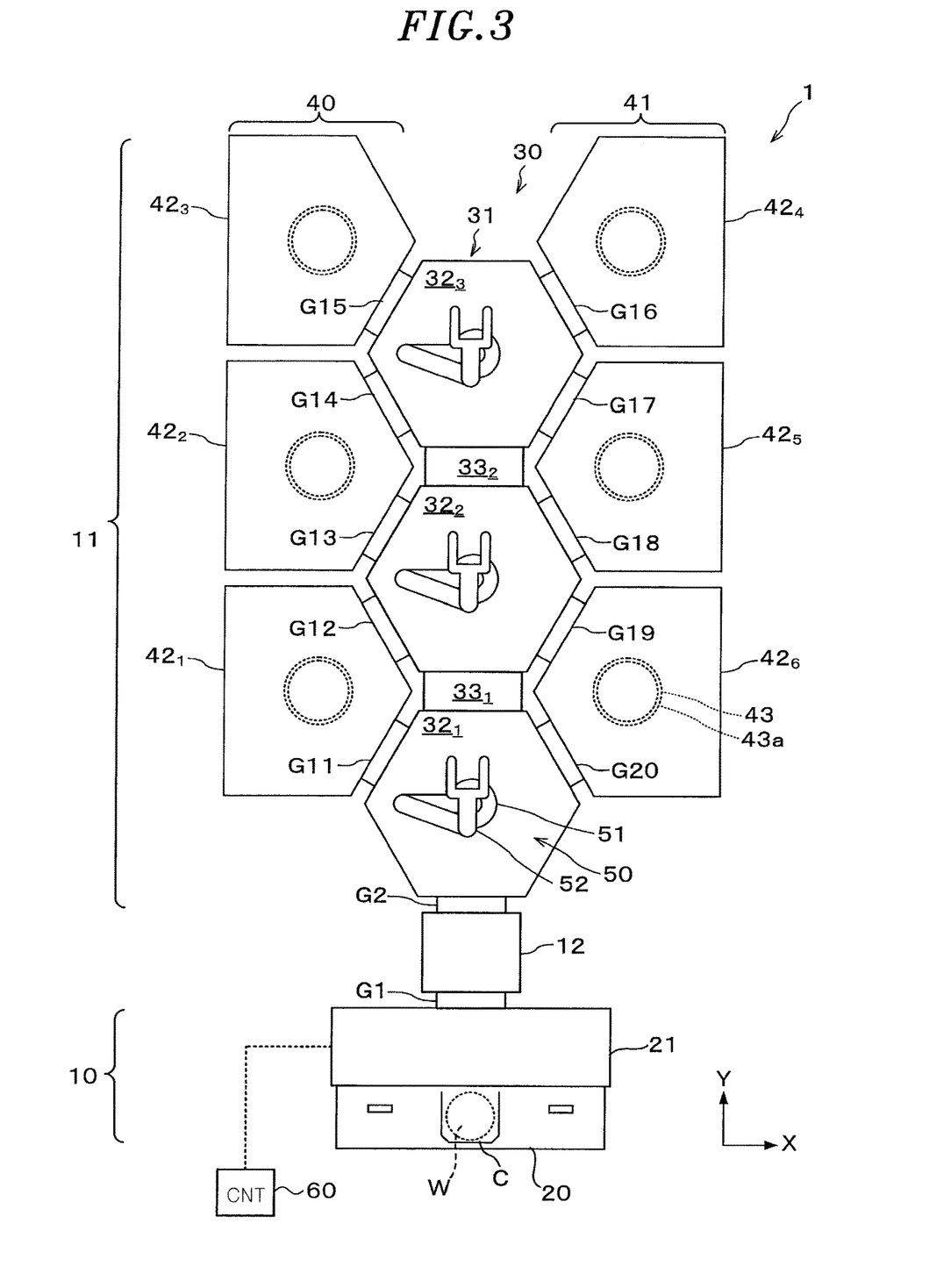
FIG. 3 is a schematic plan view showing an example of a substrate processing apparatus according to an embodiment.

FIG. 3 is a schematic plan view showing an example of the substrate processing apparatus of the present embodiment. Hereinafter, a case where the substrate processing apparatus 1 includes a processing chamber for performing film formation as a predetermined process on the wafer W serving as a substrate will be described.

The substrate processing apparatus 1 has a configuration in which a cassette station 10 for loading and unloading a cassette C capable of accommodating a plurality of wafers W and a processing station 11 including multiple processing chambers each of which performs film formation on the wafers W are integrally connected. The cassette station 10 and the processing station 11 are connected through a load-lock chamber 12. The load-lock chamber 12 connects an atmospheric pressure transfer module 21 and a vacuum transfer module 30 to be described later. An inner atmosphere of the load-lock chamber 12 can be switched between an atmospheric pressure state and a vacuum state.

The cassette station 10 includes a cassette mounting table 20 and an atmospheric pressure transfer module 21. The cassette station 10 may further include an orienter (not shown) for adjusting the orientation of the wafer W.

The cassette mounting table 20 is disposed at one end of the substrate processing apparatus 1 on the negative side of the Y direction (bottom side in FIG. 3). A plurality of, e.g., three cassettes C can be mounted on the cassette mounting table 20.

The atmospheric pressure transfer module 21 transfers the wafer W under an atmospheric pressure state by a wafer transfer mechanism (not shown). The wafer transfer mechanism includes a transfer arm for holding the wafer W substantially horizontally. The transfer arm is configured to be rotatable, extensible and contractible in a horizontal direction and movable in a vertical direction. Further, the wafer transfer mechanism is configured to transfer the wafer W while holding the wafer W by the transfer arm.

The load-lock chamber 12 is connected to the atmospheric pressure transfer module 21 on the positive side of the Y direction (upper side in FIG. 3) of the atmospheric pressure transfer module 21 through a gate valve G1. The vacuum transfer module 30 of the processing station 11, specifically, a transfer chamber $32_1$ to be described later is connected to the load-lock chamber 12 on the positive side of the Y direction through a gate valve G2.

The processing station 11 includes the vacuum transfer module 30 and a plurality (six in this example) of processing chambers $42_1$ to $42_6$ (hereinafter, may be collectively referred to as "processing chamber 42"). The inner atmosphere of each of the vacuum transfer module 30 and the processing chamber 42 are maintained in an atmosphere (vacuum atmosphere) lower than atmospheric pressure during a series of processes performed on the wafer W in the substrate processing apparatus 1.

The vacuum transfer module 30 includes a transfer chamber row 31. The transfer chamber row 31 includes a plurality (three in this example) transfer chambers $32_1$ to $32_3$ (hereinafter, may be collectively referred to as "transfer chamber 32"). The transfer chambers $32_1$ to $32_3$ are arranged linearly along the Y direction in FIG. 3. Further, the transfer chamber row 31 has relay chambers $33_1$ and $33_2$ (hereinafter, may be collectively referred to as "relay chamber 33") as functional chambers between the adjacent transfer chambers 32. Specifically, the relay chamber $33_1$ is disposed between the transfer chamber $32_1$ and the transfer chamber $32_2$, and a relay chamber $33_2$ is disposed between the transfer chamber $32_2$ and the transfer chamber $32_3$.

Each of the transfer chamber 32 and the relay chamber 33 has a hermetically sealed housing formed in a substantially polygonal shape in a plan view. The vacuum transfer module 30 has a housing formed by integrating the hermetically sealed housings.

A first processing chamber row 40 is disposed on one side of the transfer chamber row 31 in a plan view, specifically, at the outer side of the negative side of the X direction (left side in FIG. 3) of the transfer chamber row 31. The first processing chamber row 40 has a plurality (three in this example) of processing chambers $42_1$ to $42_3$. The processing chambers $42_1$ to $42_3$ are arranged along the transfer chamber row 31, i.e., in the Y direction (vertical direction in FIG. 3). The processing chambers $42_1$ to $42_3$ of the first processing chamber row 40 are arranged in a zigzag shape with respect to the transfer chambers 32 of the transfer chamber row 31. Further, the processing chambers $42_1$ to $42_3$ of the first processing chamber row 40 are connected to the corresponding transfer chambers 32. Specifically, the processing chamber $42_1$ is connected to the transfer chambers $32_1$ and $32_2$ through gate valves G11 and G12; the processing chamber $42_2$ is connected to the transfer chambers $32_2$ and $32_3$ through gate valves G13 and G14; and the processing chamber $42_3$ is connected to the transfer chamber $32_3$ through a gate valve G15.

A second process chamber row 41 is disposed on the other side of the transfer chamber row 31 in a plan view, specifically, at the outer side of the positive direction of the X direction (right side in FIG. 3) of the transfer chamber row 31. The second processing chamber row 41 has a plurality (three in this example) of processing chambers $42_4$ to $42_6$ arranged along the transfer chamber row 31. The processing chambers $42_4$ to $42_6$ of the second processing chamber row 41 are arranged in a zigzag shape with respect to the transfer chambers 32 of the transfer chamber row 31. The processing chambers $42_4$ to $42_6$ of the second processing chamber row 41 are connected to the corresponding transfer chambers 32. Specifically, the processing chamber $42_4$ is connected to the transfer chamber $32_3$ through a gate valve G16; the processing chamber $42_5$ is connected to the transfer chambers $32_3$ and $32_2$ through gate valves G17 and G18; and the processing chamber $42_6$ is connected to the transfer chambers $32_2$ and $32_1$ through gate valves G19 and G20.

The gate valves G11 to G20 are arranged at an angle of, e.g., 60° with respect to the Y direction (the vertical direction in FIG. 3) that the transfer chambers 32 are arranged.

In this example, the processing chamber rows are disposed on both sides of the transfer chamber row 31 in a plan view. However, the processing chamber row may be disposed only one of both sides of the transfer chamber row 31 in a plan view.

Each of the transfer chambers 32 arranged as described above allows a wafer W unloaded from a module (the processing chamber 42, the relay chamber 33, or the load-lock chamber 12) adjacent to the corresponding transfer chamber 32 to be transferred to another module adjacent to the corresponding transfer chamber 32.

Therefore, a wafer transfer mechanism 50 serving as a substrate transfer mechanism for holding and transferring the wafer W is disposed in each of the transfer chambers 32.

Figure 4:
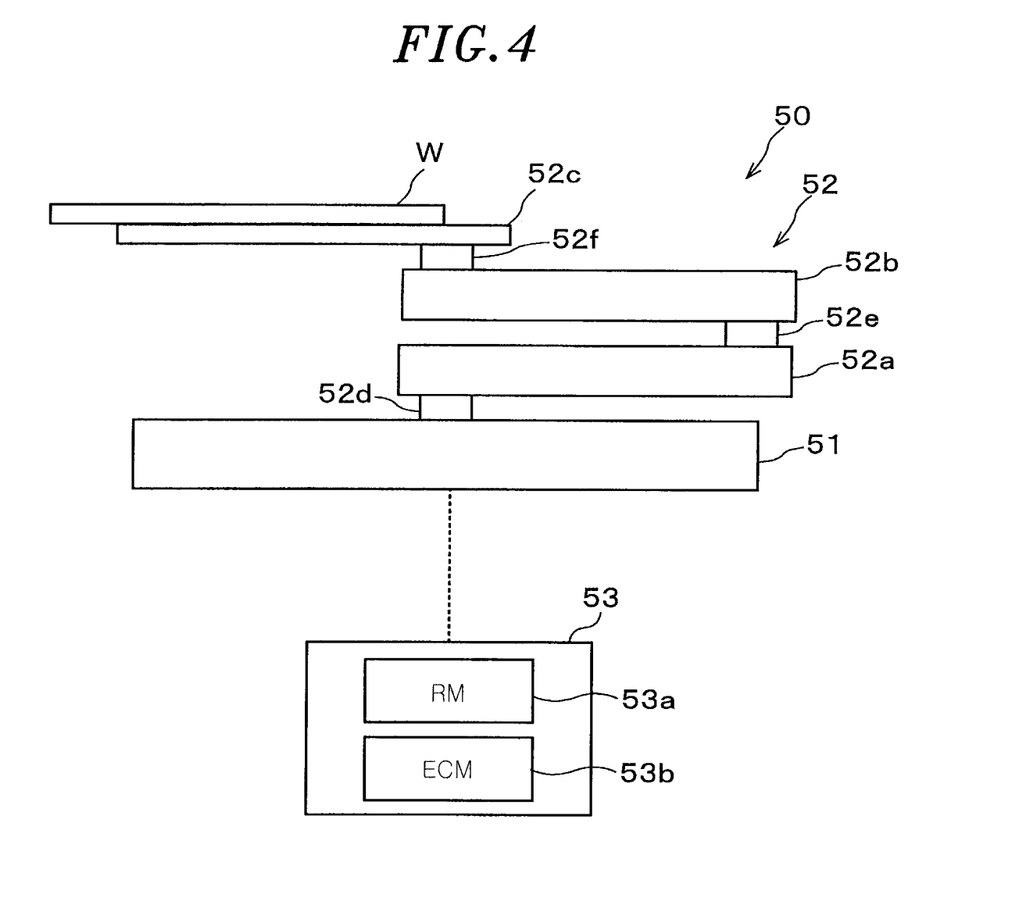
FIG. 4 is a schematic side view showing an example of a substrate transfer mechanism.

FIG. 4 is a schematic side view showing an example of the wafer transfer mechanism 50.

As shown in FIG. 4, the wafer transfer mechanism 50 includes a rotatable base 51 and a transfer arm 52 configured to be extensible and contractible in the horizontal direction. The wafer transfer mechanism 50 is connected to a driving mechanism 53.

The base 51 has, e.g., a disc shape, and is connected to a rotation motor (RM) 53a of the driving mechanism 53 for rotating or revolving the base 51 about the central axis (vertical axis) thereof.

The transfer arm 52 is, e.g., a SCARA-type multi joint arm as shown in FIG. 3. Specifically, the transfer arm 52 is formed by connecting two links 52a and 52b rotatable on a horizontal plane and an end effector 52c in series.

More specifically, a base end of a lower link 52a is attached to the base 51 through a rotation shaft 52d to be rotatable on the horizontal plane. Further, a base end of an upper link 52b is attached to a leading end of the link 52a through a rotation shaft 52e to be rotatable on the horizontal plane. A base end of the end effector 52c configured as tweezers capable of supporting and holding a wafer W thereon is attached to a leading end of the link 52b through a rotation shaft 52f to be rotatable on the horizontal plane.

The links 52a and 52b have therein a transmission mechanism (not shown) for transmitting a driving force generated by an extension/contraction motor (ECM) 53b of the driving mechanism 53 to the links 52a and 52b or the end effector 52c. The transmission mechanism includes, e.g., a pulley, a belt, a speed reducer, or the like. In the illustrated example, the links 52a and 52b and the end effector 52c are configured to rotate together about the rotation shaft 52d at the base end of the link 52a so that the end effector 52c moves linearly in the longitudinal direction thereof.

The above-described transfer arm 52 is configured to be rotatable since the transfer arm 52 rotates together with the base 51, and thus also can be extended and contracted in a desired direction.

In the following description, the wafer transfer mechanism $50_n$, the base $51_n$, and the transfer arm $52_n$ (n=1, 2, 3, 4) denote the wafer transfer mechanism 50 disposed in the transfer chamber $32_n$, and the base 51 and the transfer arm 52 of the wafer transfer mechanism 50.

Referring back to FIG. 3, the relay chamber 33 is a module used for directly transferring the wafer W between the adjacent transfer chambers 32 without passing through the processing chamber 42. Since inner spaces of the adjacent transfer chambers 32 communicate with each other through an inner space of the relay chamber 33, the wafer W can be transferred between the adjacent transfer chambers 32. The relay chamber 33 and the adjacent transfer chambers 32 may be connected through gate valves.

The processing chamber 42 performs film formation such as physical vapor deposition (PVD) or the like on the wafer W. A substrate support 43 having a wafer supporting region 43a as a substrate supporting region on which the wafer W is horizontally mounted is disposed in the processing chamber 42. An electrostatic chuck is disposed on the substrate support 43, if necessary. Further, the substrate support 43 has a flow path for a temperature control medium or a heating plate as a temperature control mechanism (not shown) for controlling a temperature of the wafer W mounted on the substrate support 43 to a desired temperature by controlling a temperature of the substrate support 43 to a desired temperature.

Different types of films may be formed in the respective processing chambers $42_1$ to $42_6$, or the same film may be formed in a part of the processing chambers 42. In the following description, it is assumed that different types of films are formed in the respective processing chambers $42_1$ to $42_6$.

The substrate processing apparatus 1 configured as describe above includes a controller (CNT) 60. The controller 60 is, e.g., a computer having a CPU, a memory, and the like, and includes a program storage unit (not shown). The program storage unit stores programs and the like for controlling the driving mechanism 53 or the like to implement a wafer processing to be described later in the substrate processing apparatus 1. Further, the programs may be stored in a computer-readable storage medium and installed in the controller 60 from the storage medium. Further, a part or all of the programs may be realized by a dedicated hardware (circuit board).

Next, the wafer processing using the substrate processing apparatus 1 configured as described above will be described.

First, the cassette C containing a plurality of wafers W is loaded into the cassette station 10 of the substrate processing apparatus 1 and mounted on the cassette mounting table 20. Then, a wafer transfer mechanism (not shown) of the atmospheric pressure transfer module 21 extracts one wafer W from the cassette C. The gate valve G1 is opened and the wafer W is loaded into the load-lock chamber 12. When the wafer W is loaded into the load-lock chamber 12, the gate valve G1 is closed and the load-lock chamber 12 is sealed and depressurized. Thereafter, the gate valve G2 is opened, and the load-lock chamber 12 and the transfer chamber $32_1$ maintained in the vacuum atmosphere communicate with each other. Then, the wafer W is unloaded from the load-lock chamber 12 and loaded into the transfer chamber $32_1$ by a transfer arm $52_1$ of a wafer transfer mechanism $50_1$.

Next, the gate valve G2 is closed and the gate valve G11 is opened, so that the transfer chamber $32_1$ and the processing chamber $42_1$ communicate with each other. Then, the wafer W is loaded into the processing chamber $42_1$ and placed on the substrate support 43 by the transfer arm $52_1$ of the wafer transfer mechanism $50_1$. The method of loading the wafer W into the processing chamber 42 will be described later.

A degas chamber (not shown) for heating and degassing the wafer W may be provided in the transfer chamber $32_1$ so that the degas process can be performed on the wafer W in the degas chamber before the loading of the wafer W into the processing chamber $42_1$.

After the wafer W is placed on the substrate support 43, the gate valve G11 is closed and the processing chamber $42_1$ is sealed. Then, film formation is performed on the wafer W in the processing chamber $42_1$. Accordingly, a desired film is formed on the wafer W.

When the processing in the processing chamber $42_1$ is completed, the gate valve G12 is opened, and the processing chamber $42_1$ and the transfer chamber $32_2$ communicate with each other. Then, the wafer W is unloaded from the processing chamber $42_1$ and loaded into the transfer chamber $32_2$ by a transfer arm $52_2$ of a wafer transfer mechanism $50_2$.

Thereafter, the gate valves G12 to G20 and G2 and/or the transfer arms $52_2$ to $52_4$ are driven in the above-described manner, and the wafer W is loaded and unloaded between the transfer chambers 32 and the processing chambers 42 in the following order of the processing chamber $42_1$→the transfer chamber $32_3$→the processing chamber $42_3$→the transfer chamber $32_3$→the processing chamber $42_4$→the transfer chamber $32_3$→the processing chamber $42_5$→the transfer chamber $32_2$→the processing chamber $42_6$→the transfer chamber $32_1$→the load-lock chamber 12.

Then, a desired film is formed on the wafer W in each of the processing chambers $42_1$ to $42_6$.

The wafer W returned to the load-lock chamber 12 is returned to the original cassette C in the reverse order of the operation of loading the wafer W from the cassette C.

The above-described wafer processing is performed on each wafer W.

Next, the position of the substrate support 43 in the processing chamber 42 will be described with reference to FIG. 5.

Figure 5:
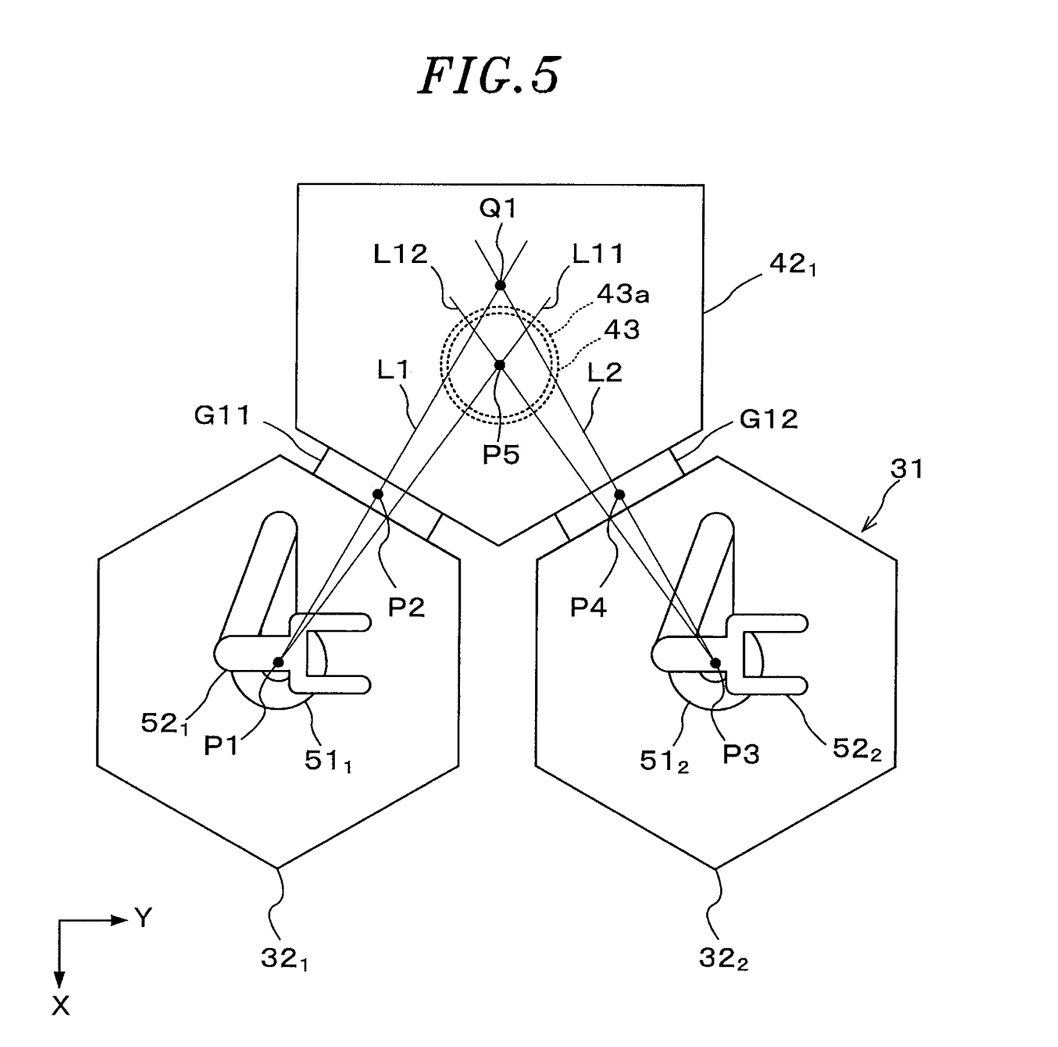
FIG. 5 shows a relationship between a substrate support in a processing chamber, a transfer chamber row, and a gate valve.

FIG. 5 shows a positional relationship between the substrate support 43, the transfer chamber row 31, and the gate valves G11 and G12 in the processing chamber $42_1$.

Referring to FIG. 5, a line L1 connects a rotation axis of the transfer arm $52_1$ of one transfer chamber $32_1$ adjacent to the processing chamber $42_1$, i.e., a rotation center P1 of the base $51_1$, and a center P2 of the gate valve G11 with respect to the transfer chamber $32_1$.

A line L2 connects a rotation axis of the transfer arm $52_2$ of the other transfer chamber $32_2$ adjacent to the processing chamber $42_1$, i.e., a rotation center P3 of the base $51_2$, and a center P4 of the gate valve G12 with respect to the transfer chamber $32_2$.

A line L11 connects a center P5 of the wafer supporting region 43a of the substrate support 43 in the processing chamber $42_1$ and the rotation center P1 of the base $51_1$, i.e., the rotation axis of the transfer arm $52_1$.

A line L12 connects the center P5 of the wafer supporting region 43a of the substrate support 43 in the processing chamber $42_1$ and the rotation center P3 of the base $51_2$, i.e., the rotation axis of the transfer arm $52_2$.

In the processing chamber $42_1$, the substrate support 43 is disposed in such a manner that the center P5 of the wafer supporting region 43a is positioned closer to the transfer chamber row 31 such that the lines L11 and L12 are closer to the transfer chamber row 31 than the lines L1 and L2. In other words, in the processing chamber $42_1$, the substrate support 43 is disposed such that the position of the center P5 of the wafer supporting region 43a is closer to the transfer chamber row 31 than the position of an intersection point Q1 of the lines L1 and L2. The above configuration allows the reduction of the footprint area of the substrate processing apparatus 1 compared to the case where the substrate support 43 is disposed such that the center P5 of the wafer supporting region 43a is positioned to coincide with the intersection point Q1.

Although it is not illustrated, the substrate support 43 is disposed in each of the processing chambers $42_2$, $42_5$ and $42_6$, similar to that in the processing chamber $42_1$.

Unlike the processing chamber $42_1$, the processing chambers $42_3$ and $42_4$ are adjacent to only one transfer chamber $32_3$ without being adjacent to two transfer chambers 32. However, the position of the substrate support 43 in each of the processing chambers $42_3$ and $42_4$ is closer to the transfer chamber row 31, similar to that in the processing chamber $42_1$.

Similarly, when the substrate support 43 is disposed in the processing chamber $42_1$ such that the position of the center P5 of the wafer supporting region 43a is closer to the transfer chamber row 31 than the position of the intersection point Q1, the following problems occur. In other words, when the wafer W is loaded and unloaded between the processing chamber $42_1$ and the transfer chamber $32_1$, if the wafer W held by the transfer arm $52_1$ is transferred linearly along the line L11 as in the conventional case, the wafer W may collide with the gate valve G11 or the like and fall from the transfer arm $52_1$.

Therefore, in the substrate processing apparatus 1 of the present embodiment, when loading and unloading the wafer W between the processing chamber $42_1$ and the transfer chamber $32_1$, the driving mechanism 53 is controlled to transfer the wafer W non-linearly, i.e., in a curved manner at the outer side of the line L11. Specifically, the driving mechanism 53 is controlled such that both of the rotation and the extension of the transfer arm $52_1$ are performed and the center of the wafer W held by the transfer arm $52_1$ passes along the outer side of the line L11. More specifically, the driving mechanism 53 is controlled such that both of the rotation and the extension of the transfer arm $52_1$ are performed and the center of the wafer W held by the transfer arm $52_1$ passes along the outer side of the line L11 while satisfying the following conditions (A) and (B):

(A) The wafer W that is being transferred does not collide with an obstacle disposed at an inner side of the apparatus width direction from the line L11 (e.g., an inner wall portion of the gate valve G11 that is disposed at the inner side of the apparatus width direction from the line L11, i.e., the positive side of the X direction), (B) The wafer W that is being transferred does not collide with an obstacle disposed at an outer side of the apparatus width direction from the line L11 (e.g., an inner wall portion of the gate valve G11 that is disposed at the outer side of the apparatus width direction from the line L11, i.e., the negative side of the X direction).

Figure 6A:
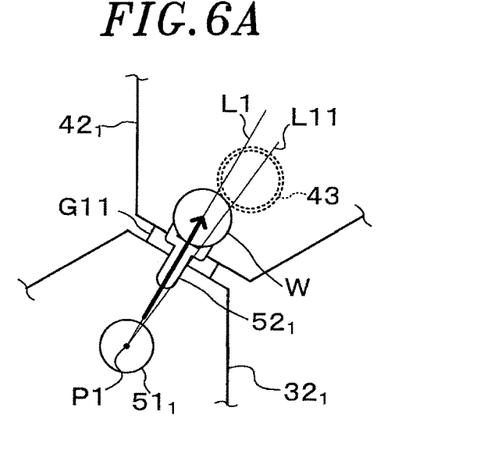
FIGS. 6A to 6C show an example of a method of transferring a substrate from a transfer chamber to a processing chamber.
Figure 6B:
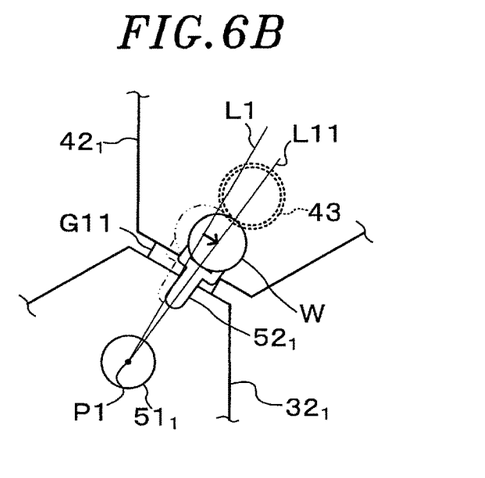
Figure 6C:
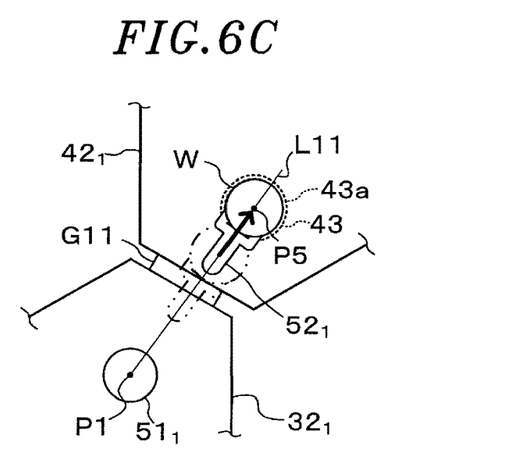

FIGS. 6A to 6C show an example of a method of transferring the wafer W in the case of loading the wafer W into the processing chamber $42_1$ from the transfer chamber $32_1$. In FIGS. 6A to 6C, the links 52a and 52b of the transfer arm $52_1$ are not illustrated.

In this transfer method, first, the controller 60 controls the extension/contraction motor 53b (see FIG. 4) to extend the transfer arm $52_1$ and transfer the wafer W held by the transfer arm $52_1$ linearly along the line L1. Specifically, the wafer W is transferred such that the center of the wafer W moves along the line L1. As shown in FIG. 6A, the wafer W is transferred to a predetermined position in the processing chamber $42_1$ through the gate valve G11.

Next, the rotation motor 53a (see FIG. 4) is controlled to rotate the transfer arm $52_1$. Specifically, as shown in FIG. 6B, the transfer arm $52_1$ rotates until the center of the wafer W held by the transfer arm $52_1$ is positioned to coincide with the line L11.

Then, the extension/contraction motor 53b (see FIG. 4) is controlled to extend the transfer arm $52_1$ and transfer the wafer W held by the transfer arm $52_1$ linearly along the line L11. Specifically, the wafer W is transferred such that the center of the wafer W moves along the line L11. As shown in FIG. 6C, the wafer W is transferred to a position above the substrate support 43 in the processing chamber $42_1$, specifically, to a position where the center of the wafer W coincides with the center P5 of the wafer supporting region 43a of the substrate support 43.

Then, the wafer W is transferred from the transfer arm $52_1$ to the substrate support 43.

Since the wafer W is transferred as described above, the wafer W does not fall from the transfer arm $52_1$ during the loading of the wafer W into the processing chamber $42_1$ from the transfer chamber $32_1$.

Further, when the transfer arm $52_1$ that is not holding the wafer W is retreated from the processing chamber $42_1$ upon completion of the loading of the wafer W, the rotation motor 53a and the extension/contraction motor 53b are controlled such that the transfer arm $52_1$ moves along a reverse path of the path described with reference to FIGS. 6A to 6C.

Further, when unloading the wafer W from the processing chamber $42_1$ to the transfer chamber $32_1$, the rotation motor 53a and the extension/contraction motor 53b are controlled such that the transfer arm $52_1$ holding the wafer W moves along the reverse path of the path described with reference to FIGS. 6A to 6C. When the transfer arm $52_1$ that is not holding the wafer W enters the processing chamber $42_1$ in order to unload the wafer W, the rotation motor 53a and the extension/contraction motor 53b are controlled such that the transfer arm $52_1$ moves along the same path as the path described with reference to FIGS. 6A to 6C.

In the case of loading and unloading the wafer W between the other processing chambers 42 and the other transfer chambers 32, the rotation motor 53a and the extension/contraction motor 53b are controlled in the above-described manner.

As described above, in the present embodiment, the substrate processing apparatus 1 for processing the wafer W includes: the transfer chamber row 31 having the plurality of transfer chambers 32 arranged linearly and maintained in a vacuum atmosphere, each of the transfer chambers 32 having therein the wafer transfer mechanism 50 for holding and transferring the wafer W using the rotatable, extensible and contractible transfer arm 52; the processing chamber rows 40 and 41 arranged on both sides of the transfer chamber row 31 along the transfer chamber row 31 in a plan view, each of the processing chamber rows 40 and 41 having the plurality of processing chambers 42 each of which is maintained in a vacuum atmosphere and has therein the wafer supporting region 43a on which the wafer W is placed; the driving mechanism 53 for driving the rotation and extension/contraction of the transfer arm 52; and the controller 60. In the substrate processing apparatus 1, the processing chamber 42 is connected to two transfer chambers 32 adjacent to the processing chamber 42 through gate valves (e.g., the gate valves G11 and G12). Further, the center of the wafer supporting region 43a in the processing chamber 42 is positioned closer to the transfer chamber row 31 such that the lines (e.g. the lines L11 and L12) connecting the center of the wafer supporting region 43a with the rotation axes of the transfer arms 52 of the two transfer chambers 32 adjacent to the processing chamber 42 are closer to the transfer chamber row 31 than the lines (e.g., the lines L1 and L2) respectively connecting the rotation axes of the transfer arms 52 of the two transfer chambers 32 adjacent to the processing chamber 42 with the centers of the gate valves with respect to the transfer chambers 32. Therefore, even when the transfer chamber row 31 has the relay chamber 33 between the adjacent transfer chambers 32, it is possible to prevent the substrate processing apparatus 1 from being scaled up in the apparatus width direction, which makes it possible to prevent the scaling up of the substrate processing apparatus 1. Further, even when the transfer chamber row 31 does not have the relay chamber 33 between the adjacent transfer chambers 32, the substrate processing apparatus 1 can be scaled down in the apparatus width direction by employing the above-described configuration.

Further, in the present embodiment, the controller 60 is configured to control the driving mechanism 53 such that the center of the wafer W held by the transfer arm 52 of the transfer chamber 32 passes along the outer side of the line (e.g., the line L11 in the case of loading the wafer W from the transfer chamber $32_1$ into the processing chamber $42_1$) that connects the rotation axis of the transfer arm 52 and the center of the wafer supporting region 43a in the processing chamber 42 in the case of loading and unloading the wafer W between the processing chamber 42 and the transfer chamber 32 adjacent to the processing chamber 42. Therefore, even if the above-described configuration of the substrate processing apparatus 1 is employed to prevent the scaling up of the apparatus or to scale down the apparatus, the wafer W does not fall from the transfer arm 52 during the transfer operation.

Figure 7A:
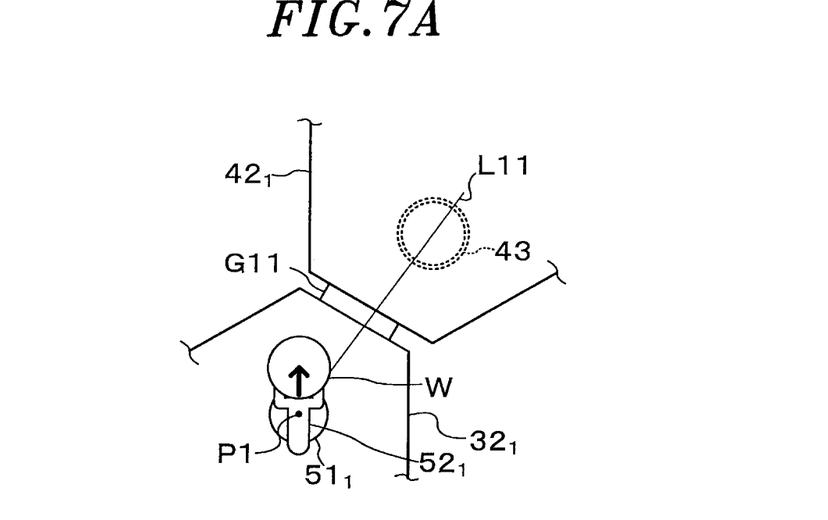
FIGS. 7A and 7B show another example of the method of transferring the substrate from the transfer chamber to the processing chamber.
Figure 7B:
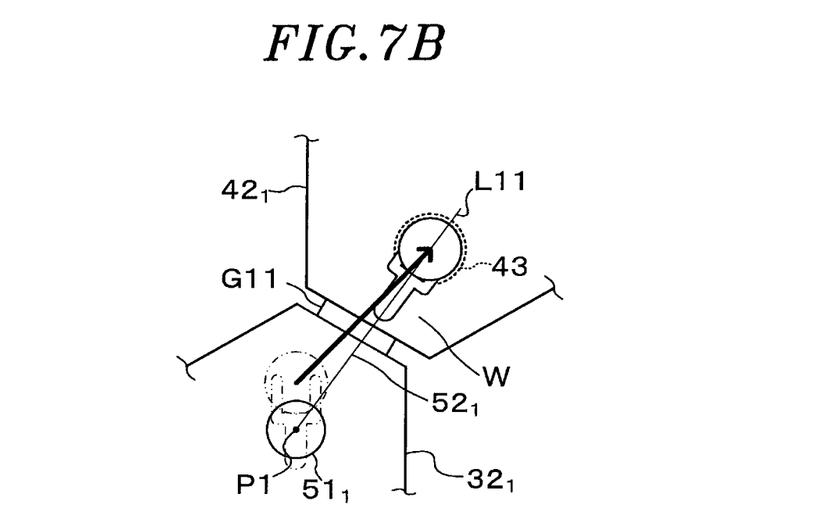

FIGS. 7A and 7B show another example of the method of transferring the wafer W from the transfer chamber $32_1$ into the processing chamber $42_1$. In FIGS. 7A and 7B, the links 52a and 52b of the transfer arm $52_1$ are not illustrated, as in FIGS. 6A to 6C.

In this transfer method, first, the controller 60 controls at least one of the rotation motor 53a and the extension/contraction motor 53b (see FIG. 4) to perform at least one of the rotation and the extension of the transfer arm $52_1$. Accordingly, the wafer W held by the transfer arm $52_1$ is transferred to a predetermined position in the transfer chamber $32_1$ as shown in FIG. 7A. The predetermined position is a position where the entire wafer W is exposed on the processing chamber $42_1$ side through the gate valve G11 when viewed from the position of the substrate support 43.

Then, the controller 60 controls the rotation motor 53a and the extension/contraction motor 53b (see FIG. 4) such that the transfer arm $52_1$ is rotated and extended to be moved substantially linearly. As shown in FIG. 7B, the wafer W is transferred to a position above the substrate support 43 in the processing chamber $42_1$, specifically, to a position where the center of the wafer W coincides with the center P5 of the wafer supporting region 43a of the substrate support 43.

In this transfer method, the wafer W loaded from the transfer chamber $32_1$ into the processing chamber $42_1$ is prevented from colliding with the gate valve G11 or the like and falling from the transfer arm $52_1$.

In the transfer method described with reference to FIGS. 6A to 6C, two transfer points on the transfer route of the wafer W are set. However, in the transfer method shown in FIGS. 7A and 7B, only one transfer point on the transfer route of the wafer W is set. As the number of transfer points on the transfer route of the wafer W becomes smaller, the wafer can be transferred with a higher accuracy. In the transfer method shown in FIGS. 7A and 7B, the number of transfer points is one, so that the wafer can be transferred with a higher accuracy.

Further, in the transfer method shown in FIGS. 7A and 7B, the number of transfer points is small, so that the increase in the wafer transfer time can be suppressed.

In the above embodiments, the insertion and extraction path of the transfer arm 52 into and from the processing chamber 42 is the same regardless of whether the transfer arm 52 is holding the wafer W or not. However, the transfer arm 52 may not collide with the gate valve or the like even when the transfer arm 52 that is not holding the wafer W is moved linearly from the start to the end of the insertion/extraction operation. In this case, the transfer arm 52 that is not holding the wafer W can be moved linearly during the insertion/extraction operation. Accordingly, the time required for inserting and extracting the transfer arm 52 that is not holding the wafer W can be reduced.

Although the film formation has been described above as an example, the present disclosure is not limited thereto and the technique of the present disclosure may be used for forming another processing such as etching or the like, in addition to the film formation.

The presently disclosed embodiments of the present disclosure are considered in all respects to be illustrative and not restrictive. The above-described embodiments can be embodied in various forms. Further, the above-described embodiments may be omitted, replaced, or changed in various forms without departing from the scope of the appended claims and the gist thereof.

The following configurations are also included in the technical scope of the present disclosure.

(1) A substrate processing apparatus for processing a substrate includes: a transfer chamber row of a plurality of transfer chambers arranged linearly and maintained in a vacuum atmosphere, each of the transfer chambers having therein a substrate transfer mechanism configured to hold and transfer the substrate using a rotatable and extensible/contractible transfer arm; a processing chamber row of a plurality of processing chambers maintained in a vacuum atmosphere and arranged on one side or both sides of the transfer chamber row along the transfer chamber row in a plan view, each of the processing chambers having therein a substrate supporting region on which the substrate is placed; a driving mechanism configured to rotate, extend, and contract the transfer arm; and a controller. Further, for a processing chamber connected to two transfer chambers adjacent thereto through gate valves, a center of the substrate supporting region in the processing chamber is positioned closer to the transfer chamber row such that lines connecting the center of the substrate supporting region with rotation axes of transfer arms in the two transfer chambers adjacent to the processing chamber are closer to the transfer chamber row than lines respectively connecting the rotation axes of transfer arms in the two transfer chambers with centers of the gate valves with respect to the two transfer chambers, and the controller is configured to control, when loading and unloading the substrate between the processing chamber and each of the two transfer chambers adjacent to the processing chamber, the driving mechanism such that a center of the substrate held by the transfer arm of each of the two transfer chambers passes along an outer side of a line that connects the rotation axis of the transfer arm and the center of the substrate supporting region in the processing chamber.

In accordance with the configuration (1), the scaling up of the substrate processing apparatus can be prevented by suppressing the scaling up of the substrate processing apparatus in the apparatus width direction orthogonal to the direction that the transfer chambers are arranged even when the transfer chamber row has the function chamber between the adjacent transfer chambers. Further, the substrate processing apparatus can be scaled down in the apparatus width direction when the transfer chamber row does not have the functional chamber between the adjacent transfer chambers.

Further, in accordance with the configuration (1), the substrate held by the transfer arm of the transfer chamber can be prevented from colliding with the gate valve or the like and falling from the transfer arm during the loading/unloading of the substrate between the processing chamber and the transfer chamber adjacent to the processing chamber 42.

(2) In the substrate processing apparatus of the configuration (1), when the substrate is loaded from each of the two transfer chambers into the processing chamber adjacent to the two transfer chambers, the controller is configured to control the driving mechanism to initially transfer the substrate held by the transfer arm of the corresponding transfer chamber along the line that connects the rotation axis of the transfer arm and the center of the gate valve with respect to the corresponding transfer chamber until the substrate passes through the gate valve; then rotate the transfer arm; and thereafter transfer the substrate held by the transfer arm along the line that connects the rotation axis of the transfer arm and the center of the substrate supporting region in the processing chamber that is a transfer destination.

(3) In the substrate processing apparatus of the configuration (1), when the substrate is loaded from each of the two transfer chambers into the processing chamber adjacent to the two transfer chambers, the controller is configured to control the driving mechanism such that the substrate held by the transfer arm in the corresponding transfer chamber is transferred to a predetermined position in the corresponding transfer chamber, and then the transfer arm rotates and extends to transfer the substrate to the center of the substrate supporting region in the corresponding transfer chamber that is a transfer destination.

(4) In the substrate processing apparatus of any one of the configurations (1) to (3), the transfer chamber row has a functional chamber between adjacent transfer chambers.

(5) In the substrate processing apparatus of any one of the configurations (1) to (4), the transfer arm is a multi joint arm.

(6) In the substrate processing apparatus of any one of the configurations (1) to (5), the processing chambers of the processing chamber row are arranged in a zigzag shape with respect to the transfer chambers of the transfer chamber row.

(7) In a substrate transfer method for transferring a substrate in a substrate processing apparatus for processing the substrate, the substrate processing apparatus includes a transfer chamber row of a plurality of transfer chambers arranged linearly and maintained in a vacuum atmosphere, each of the transfer chambers having therein the substrate transfer mechanism configured to hold and transfer a substrate using a rotatable and extensible/contractible transfer arm; and a processing chamber row of a plurality of processing chambers maintained in a vacuum atmosphere and arranged on one side or both sides of the transfer chamber row along the transfer chamber row in a plan view, each of the processing chambers having therein a substrate supporting region on which the substrate is placed. The substrate transfer method includes, for a processing chamber connected to two transfer chambers adjacent to the processing chamber through gate valves, transferring the substrate such that when loading and unloading the substrate between the processing chamber and each of the two transfer chambers adjacent to the processing chamber, a center of the substrate held by the transfer arm of each of the two transfer chambers passes along an outer side of a line that connects a rotation axis of the transfer arm and a center of the substrate supporting region in the processing chamber.

(8) The substrate transfer method of the configuration (7) further includes loading the substrate from each of the two transfer chambers into the processing chamber adjacent to the two transfer chambers. The loading of the substrate includes initially transferring the substrate held by the transfer arm of the corresponding transfer chamber along the line that connects the rotation axis of the transfer arm and the center of the gate valve with respect to the corresponding transfer chamber until the substrate passes through the gate valve; then rotating the transfer arm; and thereafter transferring the substrate held by the transfer arm along the line that connects the rotation axis of the transfer arm and the center of the substrate supporting region in the processing chamber that is a transfer destination.

(9) The substrate transfer method of the configuration (7) further includes loading the substrate from each of the two transfer chambers into the processing chamber adjacent to the two transfer chamber. The loading of the substrate includes linearly transferring the substrate held by the transfer arm of the corresponding transfer chamber to a predestined position in the corresponding transfer chamber; and then rotating and extending the transfer arm to transfer the substrate to the center of the substrate supporting region in the processing chamber that is a transfer destination.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing apparatus for processing a substrate, comprising:
   a transfer chamber row of a plurality of transfer chambers arranged linearly and maintained in a vacuum atmosphere, each of the transfer chambers having therein a substrate transfer mechanism configured to hold and transfer the substrate using a rotatable and extensible/contractible transfer arm;
   a processing chamber row of a plurality of processing chambers maintained in a vacuum atmosphere and arranged on one side or both sides of the transfer chamber row along the transfer chamber row in a plan view, each of the processing chambers having therein a substrate supporting region on which the substrate is placed;
   a driving mechanism configured to rotate, extend, and contract the transfer arm; and
   a controller,
   wherein, for a processing chamber connected to two transfer chambers adjacent thereto through gate valves, a center of the substrate supporting region in the processing chamber is positioned closer to the transfer chamber row such that lines connecting the center of the substrate supporting region with rotation axes of transfer arms in the two transfer chambers adjacent to the processing chamber are closer to the transfer chamber row than lines respectively connecting the rotation axes of transfer arms in the two transfer chambers with centers of the gate valves with respect to the two transfer chambers, and
   the controller is configured to control, when loading and unloading the substrate between the processing chamber and each of the two transfer chambers adjacent to the processing chamber, the driving mechanism such that a center of the substrate held by the transfer arm of each of the two transfer chambers passes along an outer side of a line that connects the rotation axis of the transfer arm and the center of the substrate supporting region in the processing chamber.

2. The substrate processing apparatus of claim 1, wherein when the substrate is loaded from each of the two transfer chambers into the processing chamber adjacent to the two transfer chambers, the controller is configured to control the driving mechanism to:
   initially transfer the substrate held by the transfer arm of the corresponding transfer chamber along the line that connects the rotation axis of the transfer arm and the center of the gate valve with respect to the corresponding transfer chamber until the substrate passes through the gate valve,
   then rotate the transfer arm, and
   thereafter transfer the substrate held by the transfer arm along the line that connects the rotation axis of the transfer arm and the center of the substrate supporting region in the processing chamber that is a transfer destination.

3. The substrate processing apparatus of claim 1, wherein when the substrate is loaded from each of the two transfer chambers into the processing chamber adjacent to the two transfer chambers, the controller is configured to control the driving mechanism such that the substrate held by the transfer arm in the corresponding transfer chamber is transferred to a predetermined position in the corresponding transfer chamber, and then the transfer arm rotates and extends to transfer the substrate to the center of the substrate supporting region in the corresponding transfer chamber that is a transfer destination.

4. The substrate processing apparatus of claim 1, wherein the transfer chamber row has a functional chamber between adjacent transfer chambers.

5. The substrate processing apparatus of claim 1, wherein the transfer arm is a multi-joint arm.

6. The substrate processing apparatus of claim 1, wherein the processing chambers of the processing chamber row are arranged in a zigzag shape with respect to the transfer chambers of the transfer chamber row.

7. A substrate transfer method for transferring a substrate in a substrate processing apparatus for processing the substrate, wherein the substrate processing apparatus includes a transfer chamber row of a plurality of transfer chambers arranged linearly and maintained in a vacuum atmosphere, each of the transfer chambers having therein the substrate transfer mechanism configured to hold and transfer a substrate using a rotatable and extensible/contractible transfer arm; and a processing chamber row of a plurality of processing chambers maintained in a vacuum atmosphere and arranged on one side or both sides of the transfer chamber row along the transfer chamber row in a plan view, each of the processing chambers having therein a substrate supporting region on which the substrate is placed, the substrate transfer method comprising:
for a processing chamber connected to two transfer chambers adjacent to the processing chamber through gate valves, transferring the substrate such that when loading and unloading the substrate between the processing chamber and each of the two transfer chambers adjacent to the processing chamber, a center of the substrate held by the transfer arm of each of the two transfer chambers passes along an outer side of a line that connects a rotation axis of the transfer arm and a center of the substrate supporting region in the processing chamber.

8. The substrate transfer method of claim 7, further comprising:
loading the substrate from each of the two transfer chambers into the processing chamber adjacent to the two transfer chambers,
wherein said loading includes:
initially transferring the substrate held by the transfer arm of the corresponding transfer chamber along the line that connects the rotation axis of the transfer arm and the center of the gate valve with respect to the corresponding transfer chamber until the substrate passes through the gate valve;
then rotating the transfer arm; and
thereafter transferring the substrate held by the transfer arm along the line that connects the rotation axis of the transfer arm and the center of the substrate supporting region in the processing chamber that is a transfer destination.

9. The substrate transfer method of claim 7, further comprising:
loading the substrate from each of the two transfer chambers into the processing chamber adjacent to the two transfer chambers;
wherein said loading includes:
linearly transferring the substrate held by the transfer arm of the corresponding transfer chamber to a predestined position in the corresponding transfer chamber; and
then rotating and extending the transfer arm to transfer the substrate to the center of the substrate supporting region in the processing chamber that is a transfer destination.

* * * * *